United States Patent
Cherif et al.

(10) Patent No.: US 12,289,103 B2
(45) Date of Patent: *Apr. 29, 2025

(54) TRAP CIRCUITS FOR USE WITH DIFFERENTIAL CAPACITIVELY-COUPLED RESONANT CLOCK NETWORKS

(71) Applicant: Microsoft Technology Licensing, LLC, Redmond, WA (US)

(72) Inventors: Bouchaib Cherif, Yorktown Heights, NY (US); Max Earl Nielsen, Pocatello, ID (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1088 days.

This patent is subject to a terminal disclaimer.

(21) Appl. No.: 17/194,547

(22) Filed: Mar. 8, 2021

(65) Prior Publication Data

US 2022/0286136 A1    Sep. 8, 2022

(51) Int. Cl.
*H03K 19/195*    (2006.01)
*H03K 19/00*    (2006.01)
(Continued)

(52) U.S. Cl.
CPC ....... *H03K 19/195* (2013.01); *H03K 19/0016* (2013.01); *H03K 19/018521* (2013.01); *H10N 60/805* (2023.02)

(58) Field of Classification Search
CPC . H03K 19/195; H03K 19/0016; H10N 60/805
See application file for complete search history.

(56) References Cited

U.S. PATENT DOCUMENTS 9,509,490 B1    11/2016    Dabral
10,608,044 B1    3/2020    Herr et al.
(Continued)

FOREIGN PATENT DOCUMENTS

WO    2020146165 A1    7/2020

OTHER PUBLICATIONS

"Notice of Allowance Issued in U.S. Appl. No. 17/669,502", Mailed Date: Jan. 13, 2023, 7 Pages.
(Continued)

*Primary Examiner* — Paul A Wartalowicz
(74) *Attorney, Agent, or Firm* — Ranjeev Singh; Singh Law, PLLC

(57) ABSTRACT

Trap circuits for use with superconducting integrated circuits having differential capacitively-coupled resonant clock networks are described. An example superconducting integrated circuit (IC) includes a first superconducting circuit comprising: (1) a first Josephson junction (JJ) coupled via a first capacitor to a first clock line, where the first capacitor is configured to receive a first clock signal having a first phase via the first clock line and couple a first bias current
(Continued)

to the first JJ, and (2) a second JJ coupled via a second capacitor to a second clock line, where the second capacitor is configured to receive a second clock signal having a second phase via the second clock line and couple a second bias current to the second JJ. The superconducting IC further includes a first trap circuit for the first superconducting circuit and a second trap circuit for a second superconducting circuit having additional JJs.

20 Claims, 5 Drawing Sheets

(51) Int. Cl.
*H03K 19/0185* (2006.01)
*H10N 60/80* (2023.01)

(56) References Cited

U.S. PATENT DOCUMENTS

| | | | |
|---|---|---|---|
| 10,754,371 B1 | 8/2020 | Strong et al. | |
| 11,283,445 B1* | 3/2022 | Cherif | G06F 1/10 |
| 11,652,480 B2* | 5/2023 | Cherif | G06F 1/10 |
| | | | 327/528 |
| 2006/0091928 A1* | 5/2006 | Kapur | G06F 1/08 |
| | | | 327/298 |
| 2016/0112031 A1 | 4/2016 | Abraham et al. | |
| 2019/0326501 A1 | 10/2019 | Gilbert et al. | |
| 2022/0286129 A1 | 9/2022 | Cherif et al. | |

OTHER PUBLICATIONS

"International Search Report and Written Opinion Issued in PCT Application No. PCT/US22/19154", Mailed Date: Jun. 27, 2022, 13 Pages.

"Non Final Office Action Issued in U.S. Appl. No. 17/669,502", Mailed Date: Sep. 22, 2022, 13 Pages.

"International Search Report and Written Opinion Issued in PCT Application No. PCT/US2022/017394", Mailed Date: Jun. 15, 2022, 12 Pages.

"Non Final Office Action Issued in U.S. Appl. No. 17/194,578", Mailed Date: Jul. 28, 2021, 13 Pages.

"Notice of Allowance Issued in U.S. Appl. No. 17/194,578", Mailed Date: Nov. 15, 2021, 9 Pages.

Kundert, Ken, "Bypass or Decouple your Way to Power Supply Noise Reduction", Retrieved From: https://www.eetimes.com/bypass-or-decouple-your-way-to-power-supply-noise-reduction/#:~: text=Bypassing%20is%20used%20to%20reduce,from%20one%20circuit%20to%20another., Oct. 17, 2005, 7 Pages.

U.S. Appl. No. 17/669,502, filed on Feb. 11, 2022.

* cited by examiner

400

TRAP CIRCUITS FOR USE WITH DIFFERENTIAL CAPACITIVELY-COUPLED RESONANT CLOCK NETWORKS

BACKGROUND

Semiconductor based integrated circuits used in electronic devices, such as digital processors, include digital circuits based on complimentary metal-oxide semiconductor (CMOS) technology or similar technologies. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits. Such circuits may also be used in combination with CMOS technology based components.

SUMMARY

In one example, the present disclosure relates to a superconducting integrated circuit including a first superconducting circuit comprising: (1) a first Josephson junction coupled via a first capacitor to a first clock line, where the first capacitor is configured to receive a first clock signal having a first phase via the first clock line and couple a first bias current to the first Josephson junction, and (2) a second Josephson junction coupled via a second capacitor to a second clock line, where the second capacitor is configured to receive a second clock signal having a second phase, different from the first phase, via the second clock line and couple a second bias current to the second Josephson junction. The superconducting integrated circuit may further include a second superconducting circuit comprising: (1) a third Josephson junction coupled via a third capacitor to the first clock line, where the third capacitor is configured to receive the first clock signal having the first phase via the first clock line and couple a third bias current to the third Josephson junction, and (2) a fourth Josephson junction coupled via a fourth capacitor to the second clock line, where the fourth capacitor is configured to receive the second clock signal having the second phase via the second clock line and couple a fourth bias current to the fourth Josephson junction. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second capacitor and the second Josephson junction, where the second trap circuit is configured to attenuate any signals generated by a triggering of the second Josephson junction to reduce crosstalk between the second Josephson junction and the fourth Josephson junction.

In another aspect, the present disclosure relates to a superconducting integrated circuit including a resonant clock network capacitively-coupled to: (1) a first superconducting circuit comprising a first Josephson junction and a second Josephson junction, and (2) a second superconducting circuit comprising a third Josephson junction and a fourth Josephson junction. The superconducting integrated circuit may further include a first trap circuit coupled between the first Josephson junction and the resonant clock network, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second Josephson junction and the resonant clock network, where the second trap circuit is configured to attenuate any signals generated by a triggering of the second Josephson junction to reduce crosstalk between the second Josephson junction and the fourth Josephson junction.

In yet another aspect, the present disclosure relates to a superconducting integrated circuit including a first superconducting circuit comprising: (1) a first Josephson junction coupled via a first capacitor to a first clock line, where the first capacitor is configured to receive a first alternating current (AC) dock signal having a first phase via the first dock line and couple a first bias current to the first Josephson junction, and (2) a second Josephson junction coupled via a second capacitor to a second clock line, where the second capacitor is configured to receive a second AC clock signal having a second phase, opposite to the first phase, via the second clock line and couple a second bias current to the second Josephson junction. The superconducting integrated circuit may further include a second superconducting circuit comprising: (1) a third Josephson junction coupled via a third capacitor to the first clock line, where the third capacitor is configured to receive the first AC clock signal having the first phase via the first clock line and couple a third bias current to the third Josephson junction, and (2) a fourth Josephson junction coupled via a fourth capacitor to the second clock line, where the fourth capacitor is configured to receive the second AC clock signal having the second phase via the second clock line and couple a fourth bias current to the second Josephson junction. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second capacitor and the second Josephson junction, wherein the second trap circuit is configured to attenuate any signals generated by a triggering of the second Josephson junction to reduce crosstalk between the second Josephson junction and the fourth Josephson junction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
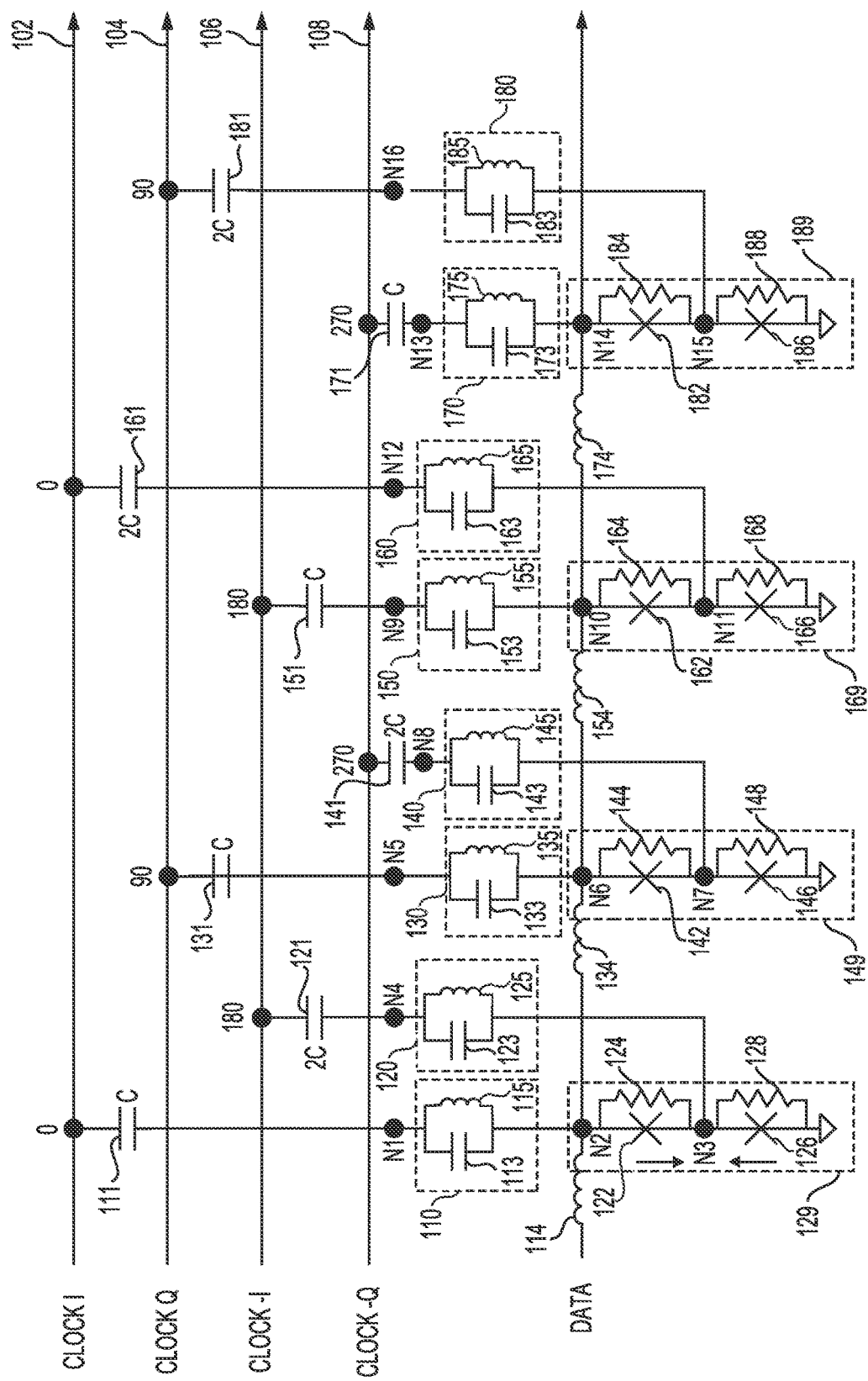
FIG. 1 is a diagram of a superconducting integrated circuit including trap circuits in accordance with one example.

Examples described in this disclosure relate to trap circuits for use with differential capacitively-coupled resonant clock networks. Certain examples further relate to the use of trap circuits along with superconducting circuits that are clocked using differential capacitively-coupled resonant clock networks. In certain examples, the superconducting circuits may be powered using alternating current (AC). The superconducting circuits may be reciprocal quantum logic (RQL) circuits that may be implemented using wave pipelined logic. Such RQL circuits may act as low-power superconductor logic circuits.

Unlike CMOS transistors, superconductor circuits use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary iodic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Certain examples described in this disclosure relate to inserting a trap circuit between the bias capacitor of a differential capacitively-coupled resonant clock network (CRCN) and the Josephson junction it supplies. This trap circuit is tuned such that its parallel resonant frequency is near the frequency at which a Josephson junction rings when it triggers to generate a single flux quantum (SFQ) pulse. Thus tuned, the trap circuit presents a high impedance to the signals having frequencies associated with the SFQ pulse and the Josephson junction ringing. This high impedance greatly attenuates the interference to the Josephson junctions of nearby gates, almost eliminating the performance degradations that un-attenuated pulses cause. As used herein the term "trap circuit" incudes, but is not limited to, several examples of trap circuits described herein. In general, the term "trap circuit" includes any circuit arrangement that could be used to present a high impedance to signals generated as a result of the triggering of a Josephson junction that could create unwanted crosstalk.

Certain examples described herein reduce the transfer of the SFQ pulses from the Josephson junctions that trigger to the Josephson junctions in nearby superconducting logic gates. Un-attenuated, this unwanted transfer of pulses negatively affects the operating margins of the superconducting logic gates. In addition, in some instances, such unwanted transfer of the pulses may introduce deterministic jitter.

Certain examples further relate to differential capacitively-coupled resonant clock networks (CRCN) with "differential capacitive feed transmission lines." Capacitors are used to couple superconducting logic gates with such transmission lines. The transmission lines are generally designed to resonate with the capacitors and the capacitive feed transmission line at the desired operating frequency. Clock sources may connect at the junctions between the resonating inductances and the capacitive feed transmission line. When a Josephson junction triggers its energy is transferred to the circuit it connects to by means of currents flowing out of it (or in some cases flowing into it). Ideally, the current generated by the Josephson junction's triggering may flow into the inductors that connect to the Josephson junctions of the gates in the circuit it drives, and some current may flow back into the triggered Josephson junction itself or the Josephson junctions that drive the triggered Josephson junction. However, unwanted current can flow to the nearby Josephson junctions that are also capacitively coupled to the same capacitive transmission feed line. This is because the bias capacitors used for coupling are selected to have low impedance at the clock frequency of the resonant clock network. As an example, the unwanted current in the immediately adjacent Josephson junctions may be about ⅕th of the current in the triggered Josephson junction. The unwanted currents in the next-nearest, second nearest, out to about the fifth or the sixth nearest neighbors, while reducing with distance, may still be significant. Advantageously, the high impedance presented by the example trap circuits described herein greatly attenuates the interference to the Josephson junctions of nearby gates, essentially eliminating the performance degradations that un-attenuated pulses cause.

FIG. 1 is a diagram of a superconducting integrated circuit 100 including trap circuits in accordance with one example. Superconducting integrated circuit 100 may be configured to operate in a wave pipelined RQL logic mode or in phase-mode logic (PML) mode. In the wave pipelined RQL logic mode, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock. In the PML based devices, a logical '1' ray be encoded as a phase high and a logical '0' may be encoded as a phase low. The transitions between phase high and phase low may be event-triggered by single flux quantum (SFQ) pulses. Unlike wave pipelined RQL mode where the waveform is returned to zero even when a logical value does not change, in the phase-mode logic circuits the waveform is not returned to zero until the logical value of the signal changes. Thus, if a signal has ten logical one values in succession the waveform would go high when the first logical high value is presented and stay high for the remaining logical high values.

With continued reference to FIG. 1, superconducting integrated circuit 100 may include superconducting circuit 129 coupled via capacitor 111 to clock line 102 (coupled to the CLOCK I terminal) and further coupled via capacitor 121 to clock line 106 (coupled to the CLOCK −I terminal). As shown in this example, clock line 102 may receive an AC clock signal with a phase of 0 degrees and clock line 106 may receive an AC clock signal with a phase of 180 degrees. Capacitor 121 may be configured to have twice the amount of capacitance (2C) relative to the amount of the capacitance (C) of capacitor 111. This is because the bias current produced by capacitor 121 may have an amplitude that is twice the amplitude of the bias current produced by capacitor 111.

Still referring to FIG. 1, superconducting integrated circuit 100 may include an inductor 114 coupled between a DATA terminal and a node N2. Node N2 may be coupled to receive an AC clock signal via clock line 102 and a node N3 may be coupled to receive an AC clock signal via clock line 106. Superconducting circuit 129 may further include a Josephson junction (JJ) 122 coupled between the node N2 and the node N3. A resistor 124 may also be coupled between the node N2 and the node N3. Another JJ 126 may be coupled between the node N3 and a ground terminal. A resistor 128 may also be coupled between the node N3 and the ground terminal. At about the same time during the clock cycle, JJ 122 may be positively biased (e.g., via the AC clock signal having a phase of 0 degrees, which is received via clock line 102), whereas JJ 126 may be negatively biased (e.g., via the AC clock signal having a phase of 180 degrees, which is received via clock line 106) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 129 may be coupled via inductor 134 to superconducting circuit 149.

A trap circuit 110 may be coupled between a node N1 (coupled to capacitor 111) and node N2. Trap circuit 110 may include a trap capacitor 113 coupled in parallel with a trap inductor 115. Another trap circuit 120 may be coupled between a node N4 (coupled to capacitor 121) and node N3. Trap circuit 120 may include a trap capacitor 123 coupled in parallel with a trap inductor 125.

With continued reference to FIG. 1, superconducting integrated circuit 100 may further include superconducting circuit 149 coupled via capacitor 131 to clock line 104 (coupled to the CLOCK Q terminal) and further coupled via capacitor 141 to clock line 108 (coupled to the −Q terminal). As shown in this example, clock line 104 may receive an AC clock signal with a phase of 90 degrees and clock line 108 may receive an AC clock signal with a phase of 270 degrees. Capacitor 141 may be configured to have twice the amount of capacitance (2C) relative to the amount of the capacitance (C) of capacitor 131. This is because the bias current produced by capacitor 141 may have an amplitude that is twice the amplitude of the bias current produced by capacitor 131.

Still referring to FIG. 1, superconducting circuit 149 may include a node N6 coupled to receive an AC clock signal via clock line 104 and a node N7 coupled to receive an AC clock signal via clock line 108. Superconducting circuit 149 may further include a Josephson junction (JJ) 142 coupled between the node N6 and the node N7. A resistor 144 may also be coupled between the node N6 and the node N7. Another JJ 146 may be coupled between the node N7 and the ground terminal. A resistor 148 may also be coupled between the node N7 and the ground terminal. At about the same time during the clock cycle, JJ 142 may be positively biased (e.g., via the AC clock signal having a phase of 90 degrees, which is received via clock line 104), whereas JJ 146 may be negatively biased (e.g., via the AC clock signal having a phase of 270 degrees, which is received via clock line 108) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 149 may be coupled via inductor 154 to superconducting circuit 169.

A trap circuit 130 may be coupled between a node N5 (coupled to capacitor 131) and node N6. Trap circuit 130 may include a trap capacitor 133 coupled in parallel with a trap inductor 135. Another trap circuit 140 may be coupled between a node N8 (coupled to capacitor 141) and node N7. Trap circuit 140 may include a trap capacitor 143 coupled in parallel with a trap inductor 145.

With continued reference to FIG. 1, superconducting integrated circuit 100 may further include superconducting circuit 169 coupled via capacitor 151 to clock line 106 and further coupled via capacitor 161 to clock line 102. As shown in this example, clock line 102 may receive an AC clock signal with a phase of 0 degrees and clock line 106 may receive an AC clock signal with a phase of 180 degrees. Capacitor 161 may be configured to have twice the amount of capacitance (2C) relative to the amount of the capacitance (C) of capacitor 151. This is because the bias current produced by capacitor 161 may have an amplitude that is twice the amplitude of the bias current produced by capacitor 151.

Still referring to FIG. 1, superconducting circuit 169 may include a node N10 coupled to receive an AC clock signal via clock line 106 and a node N11 coupled to receive an AC clock signal via clock line 102. Superconducting circuit 169 may further include a Josephson junction (JJ) 162 coupled between the node N10 and the node N11. A resistor 164 may also be coupled between the node N10 and the node N11. Another JJ 166 may be coupled between the node N11 and the ground terminal. A resistor 168 may also be coupled between the node N11 and the ground terminal. At about the same time during the clock cycle, JJ 162 may be negatively biased (e.g., via the AC clock signal having a phase of 180 degrees, which is received via clock line 106), whereas JJ 166 may be positively biased (e.g., via the AC clock signal having a phase of 0 degrees, which is received via clock line 102) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 169 may be coupled via inductor 174 to superconducting circuit 189.

A trap circuit 150 may be coupled between a node N9 (coupled to capacitor 151) and node N10. Trap circuit 150 may include a trap capacitor 153 coupled in parallel with a trap inductor 155. Another trap circuit 160 may be coupled between a node N12 (coupled to capacitor 161) and node N11. Trap circuit 160 may include a trap capacitor 163 coupled in parallel with a trap inductor 165.

With continued reference to FIG. 1, superconducting integrated circuit 100 may further include superconducting circuit 189 coupled via capacitor 171 to clock line 108 and further coupled via capacitor 181 to clock line 104. As shown in this example, clock line 104 may receive an AC clock signal with a phase of 90 degrees and clock line 108 may receive an AC clock signal with a phase of 270 degrees. Capacitor 181 may be configured to have twice the amount of capacitance (2C) relative to the amount of the capacitance (C) of capacitor 171. This is because the bias current produced by capacitor 181 may have an amplitude that is twice the amplitude of the bias current produced by capacitor 171.

Still referring to FIG. 1, superconducting circuit 189 may include a node N14 coupled to receive an AC clock signal via clock line 108 and a node N15 coupled to receive an AC clock signal via clock line 104. Superconducting circuit 189 may further include a Josephson junction (JJ) 182 coupled between the node N14 and the node N15. A resistor 184 may also be coupled between the node N14 and the node N15. Another JJ 186 may be coupled between the node N15 and the ground terminal. A resistor 188 may also be coupled between the node N15 and the ground terminal. At about the same time during the clock cycle, JJ 182 may be negatively biased (e.g., via the AC clock signal having a phase of 270 degrees, which is received via clock line 108), whereas JJ 186 may be positively biased (e.g., via the AC clock signal having a phase of 90 degrees, which is received via clock line 104) resulting in a positive phase transition and a negative phase transition at about the same time during the clock cycle. Alternatively, these JJs may be biased at different times during the clock cycle resulting in a positive phase transition and a negative phase transition at different times during the clock cycle.

A trap circuit 170 may be coupled between a node N13 (coupled to capacitor 171) and node N14. Trap circuit 170 may include a trap capacitor 173 coupled in parallel with a trap inductor 175. Another trap circuit 180 may be coupled between a node N16 (coupled to capacitor 181) and node N15. Trap circuit 180 may include a trap capacitor 183 coupled in parallel with a trap inductor 185.

In one example, clock and power to Josephson junctions and other circuit components may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately λ/4 long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 1 shows a certain number of components of superconducting integrated circuit 100 arranged in a certain manner, there could be more or fewer number of components arranged differently. As an example, although FIG. 1 shows a specific circuit, superconducting integrated circuit 100 may include other types of circuits, such as a logic gate, a flip-flop, or a memory circuit. In addition, although FIG. 1 shows a phase separation of 90 degrees between the clock signals and four clock lines, a phase separation of 120 degrees between the clock signals and three clock lines may also be used. Moreover, although FIG.

1 shows certain phase values associated with the clock lines, the clock lines need not receive clock signals with the phase value shown in FIG. 1. As an example, clock line 102 may receive an AC clock signal with a phase of 270 degrees, clock line 104 may receive an AC clock signal with a phase of 0 degrees, clock line 106 may receive an AC clock signal with a phase of 90 degrees, and clock line 108 may receive an AC clock signal with a phase of 180 degrees. Other phase allocations may also be used.

In terms of the operation of superconducting integrated circuit 100, the AC clock signals may once again provide bias current to Josephson junctions. Superconducting circuits 129, 149, 169, and 189 include Josephson junctions coupled in series such that one of the JJs can be biased positively while the other JJ can be biased negatively. Thus, superconducting integrated circuit 100 may be configured such that both positive and negative phase transitions may occur at about the same point in the clock cycle. Alternatively, these JJs may be biased at different times during the clock cycle resulting in a positive phase transition and a negative phase transition at different times during the clock cycle. Each trap circuit may be configured to attenuate any signals generated by the triggering of the Josephson junctions. Thus, trap circuit 110 may be configured to attenuate any SFQ pulse that is generated when Josephson junction 122 is triggered. The built-in capacitance and the inductance associated with a Josephson junction resonates in a frequency band referred to as the plasma frequency of the Josephson junction. Trap circuit 110 is tuned such that its parallel resonant frequency is near the frequency (e.g., the plasma frequency of the Josephson junction) at which Josephson junction 122 rings when it triggers to generate a single flux quantum (SFQ) pulse. Thus tuned, the LC trap presents a high impedance for the frequencies of the SFQ pulse and any pulses that are generated as a result of the ringing of Josephson junction 122. This high impedance greatly attenuates the interference to the Josephson junctions of nearby gates, essentially eliminating the performance degradations that un-attenuated pulses cause. Each of the other trap circuits (e.g., trap circuits 120, 130, 140, 150, 160, 170, and 180) may operate in a similar manner to reduce the crosstalk among Josephson junctions because of the attenuation of the SFQ pulses and any other unwanted signals generated because of the ringing of the Josephson junctions.

Figure 2:
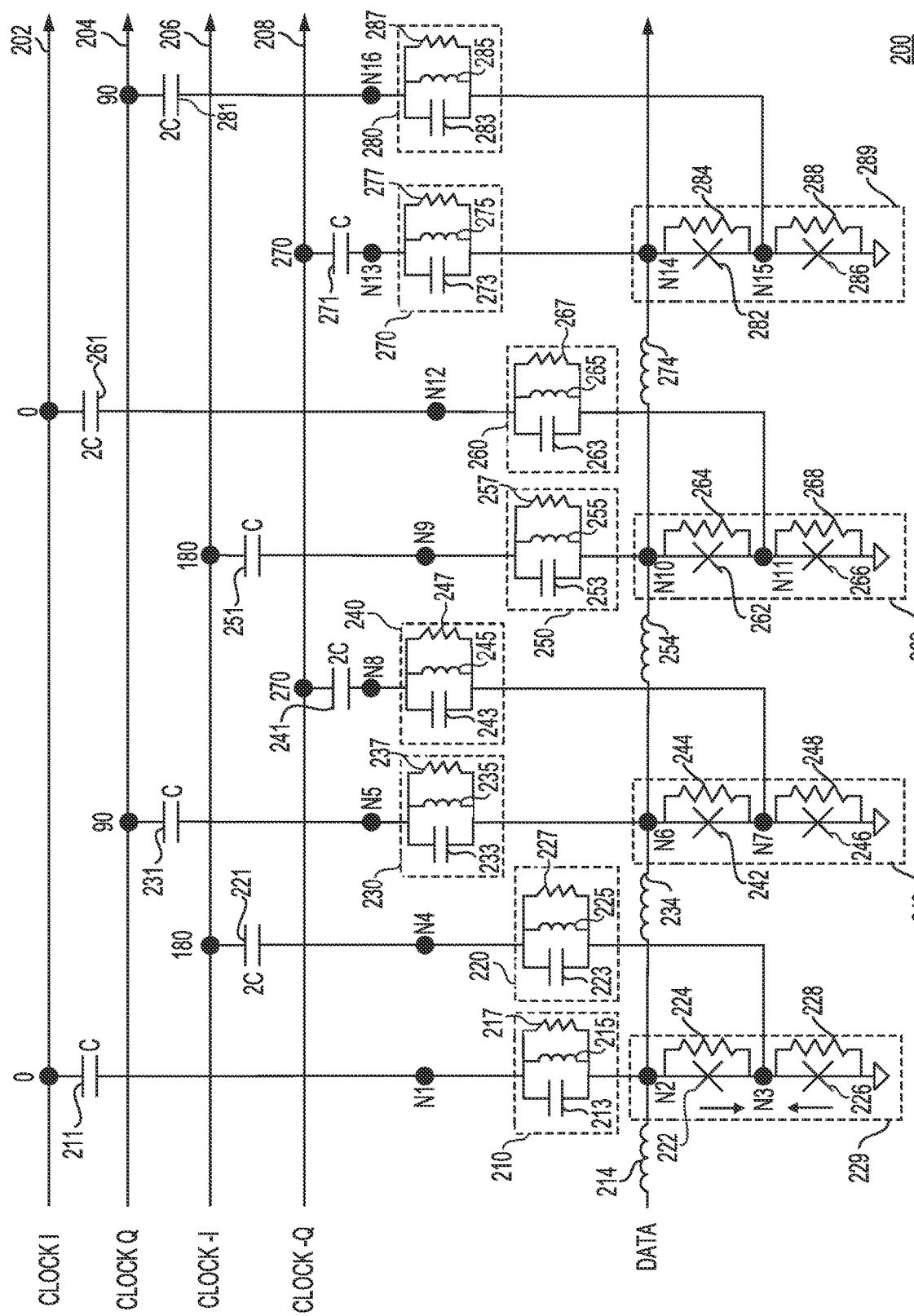
FIG. 2 is a diagram of a superconducting integrated circuit including trap circuits in accordance with another example.

FIG. 2 is a diagram of a superconducting integrated circuit 200 including trap circuits in accordance with another example. Superconducting integrated circuit 200 may also be configured to operate in a wave pipelined RQL logic mode or in phase-mode logic (PML) mode. Superconducting integrated circuit 200 may include superconducting circuit 229 coupled via capacitor 211 to clock line 202 (coupled to the CLOCK I terminal) and further coupled via capacitor 221 to clock line 206 (coupled to the CLOCK −I terminal). As shown in this example, clock line 202 may receive an AC clock signal with a phase of 0 degrees and clock line 206 may receive an AC clock signal with a phase of 180 degrees. Capacitor 221 may be configured to have twice the amount of capacitance (2C) relative to the amount of the capacitance (C) of capacitor 211. This is because the bias current produced by capacitor 221 may have an amplitude that is twice the amplitude of the bias current produced by capacitor 211.

Still referring to FIG. 2, superconducting integrated circuit 200 may include an inductor 214 coupled between a DATA terminal and a node N2. Node N2 may be coupled to receive an AC clock signal via clock line 202 and a node N3 may be coupled to receive an AC clock signal via clock line 206. Superconducting circuit 229 may further include a Josephson junction (JJ) 222 coupled between the node N2 and the node N3. A resistor 224 may also be coupled between the node N2 and the node N3. Another JJ 226 may be coupled between the node N2 and a ground terminal. A resistor 228 may also be coupled between the node N2 and the ground terminal. At about the same time during the clock cycle, JJ 222 may be positively biased (e.g., via the AC clock signal having a phase of 0 degrees, which is received via clock line 202), whereas JJ 226 may be negatively biased (e.g., via the AC clock signal having a phase of 180 degrees, which is received via clock line 206) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 229 may be coupled via inductor 234 to superconducting circuit 249.

A trap circuit 210 may be coupled between a node N1 (coupled to capacitor 211) and node N2. Trap circuit 210 may include a trap capacitor 213 coupled in parallel with a trap inductor 215 and a damping resistor 217. Another trap circuit 220 may be coupled between a node N4 (coupled to capacitor 221) and node N3. Trap circuit 220 may include a trap capacitor 223 coupled in parallel with a trap inductor 225 and a damping resistor 227.

With continued reference to FIG. 2, superconducting integrated circuit 200 may further include superconducting circuit 249 coupled via capacitor 231 to clock line 204 (coupled to the CLOCK Q terminal) and further coupled via capacitor 241 to clock line 208 (coupled to the −Q terminal). As shown in this example, clock line 204 may receive an AC clock signal with a phase of 90 degrees and clock line 208 may receive an AC clock signal with a phase of 270 degrees. Capacitor 241 may be configured to have twice the amount of capacitance (2C) relative to the amount of the capacitance (C) of capacitor 231. This is because the bias current produced by capacitor 241 may have an amplitude that is twice the amplitude of the bias current produced by capacitor 231.

Still referring to FIG. 2, superconducting circuit 249 may include a node N6 coupled to receive an AC clock signal via clock line 204 and a node N7 coupled to receive an AC clock signal via clock line 208. Superconducting circuit 249 may further include a Josephson junction (JJ) 242 coupled between the node N6 and the node N7. A resistor 244 may also be coupled between the node N6 and the node N7. Another JJ 246 may be coupled between the node N7 and the ground terminal. A resistor 248 may also be coupled between the node N7 and the ground terminal. At about the same time during the clock cycle, JJ 242 may be positively biased (e.g., via the AC clock signal having a phase of 90 degrees, which is received via clock line 204), whereas JJ 246 may be negatively biased (e.g., via the AC clock signal having a phase of 270 degrees, which is received via clock line 208) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 249 may be coupled via inductor 254 to superconducting circuit 259.

A trap circuit 230 may be coupled between a node N5 (coupled to capacitor 231) and node N6. Trap circuit 230 may include a trap capacitor 233 coupled in parallel with a trap inductor 235 and a damping resistor 237. Another trap circuit 240 may be coupled between a node N8 (coupled to capacitor 241) and node N7. Trap circuit 240 may include a trap capacitor 243 coupled in parallel with a trap inductor 245 and a damping resistor 247.

With continued reference to FIG. 2, superconducting integrated circuit 200 may further include superconducting circuit 269 coupled via capacitor 251 to clock line 206 and further coupled via capacitor 261 to clock line 202. As shown in this example, clock line 202 may receive an AC clock signal with a phase of 0 degrees and clock line 206 may receive an AC clock signal with a phase of 180 degrees. Capacitor 261 may be configured to have twice the amount of capacitance (2C) relative to the amount of the capacitance (C) of capacitor 251. This is because the bias current produced by capacitor 261 may have an amplitude that is twice the amplitude of the bias current produced by capacitor 251.

Still referring to FIG. 2, superconducting circuit 269 may include a node N10 coupled to receive an AC clock signal via clock line 206 and a node N11 coupled to receive an AC clock signal via clock line 202. Superconducting circuit 269 may further include a Josephson junction (JJ) 262 coupled between the node N10 and the node N11. A resistor 264 may also be coupled between the node N10 and the node N11. Another JJ 266 may be coupled between the node N11 and the ground terminal. A resistor 268 may also be coupled between the node N11 and the ground terminal. At about the same time during the clock cycle, JJ 262 may be negatively biased (e.g., via the AC clock signal having a phase of 180 degrees, which is received via clock line 206), whereas JJ 266 may be positively biased (e.g., via the AC clock signal having a phase of 0 degrees, which is received via clock line 202) resulting in a positive phase transition and a negative phase transition at about the same time during the clock cycle. Alternatively, these JJs may be biased at different times during the clock cycle resulting in a positive phase transition and a phase negative phase transition at different times during the clock cycle. Superconducting circuit 269 may be coupled via inductor 274 to superconducting circuit 289.

A trap circuit 250 may be coupled between a node N9 (coupled to capacitor 251) and node N10. Trap circuit 250 may include a trap capacitor 253 coupled in parallel with a trap inductor 255 and a damping resistor 257. Another trap circuit 260 may be coupled between a node N12 (coupled to capacitor 261) and node N11. Trap circuit 260 may include a trap capacitor 263 coupled in parallel with a trap inductor 265 and a damping resistor 267.

With continued reference to FIG. 2, superconducting integrated circuit 200 may further include superconducting circuit 289 coupled via capacitor 271 to clock line 208 and further coupled via capacitor 281 to clock line 204. As shown in this example, clock line 204 may receive an AC clock signal with a phase of 90 degrees and clock line 208 may receive an AC clock signal with a phase of 270 degrees. Capacitor 281 may be configured to have twice the amount of capacitance (2C) relative to the amount of the capacitance (C) of capacitor 271. This is because the bias current produced by capacitor 281 may have an amplitude that is twice the amplitude of the bias current produced by capacitor 271.

Still referring to FIG. 2, superconducting circuit 289 may include a node N14 coupled to receive an AC clock signal via clock line 208 and a node N15 coupled to receive an AC clock signal via clock line 204. Superconducting circuit 289 may further include a Josephson junction (JJ) 282 coupled between the node N14 and the node N15. A resistor 284 may also be coupled between the node N14 and the node N15. Another JJ 286 may be coupled between the node N15 and the ground terminal. A resistor 288 may also be coupled between the node N15 and the ground terminal. At about the same time during the clock cycle, JJ 282 may be negatively biased (e.g., via the AC clock signal having a phase of 270 degrees, which is received via clock line 208), whereas JJ 286 may be positively biased (e.g., via the AC clock signal having a phase of 90 degrees, which is received via clock line 204) resulting in a positive phase transition and a negative phase transition at about the same time during the clock cycle. Alternatively, these JJs may be biased at different times during the clock cycle resulting in a positive phase transition and a negative phase transition at different times during the clock cycle.

A trap circuit 270 may be coupled between a node N13 (coupled to capacitor 271) and node N14. Trap circuit 270 may include a trap capacitor 273 coupled in parallel with a trap inductor 275 and a damping resistor 277. Another trap circuit 280 may be coupled between a node N16 (coupled to capacitor 281) and node N15. Trap circuit 280 may include a trap capacitor 283 coupled in parallel with a trap inductor 285 and a damping resistor 287.

In one example, clock and power to Josephson junctions and other circuit components may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately λ/4 long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 2 shows a certain number of components of superconducting integrated circuit 200 arranged in a certain manner, there could be more or fewer number of components arranged differently. As an example, although FIG. 2 shows a specific circuit, superconducting integrated circuit 200 may include other types of circuits, such as a logic gate, a flip-flop, or a memory circuit. In addition, although FIG. 2 shows a phase separation of 90 degrees between the clock signals and four clock lines, a phase separation of 120 degrees between the clock signals and three clock lines may also be used. Moreover, although FIG. 2 shows certain phase values associated with the clock lines, the clock lines need not receive clock signals with the phase value shown in FIG. 2. As an example, clock line 202 may receive an AC clock signal with a phase of 270 degrees, clock line 204 may receive an AC clock signal with a phase of 0 degrees, clock line 206 may receive an AC clock signal with a phase of 90 degrees, and clock line 208 may receive an AC clock signal with a phase of 180 degrees. Other phase allocations may also be used.

In terms of the operation of superconducting integrated circuit 200, the AC clock signals may once again provide bias current to Josephson junctions. Superconducting circuits 229, 249, 269, and 289 include Josephson junctions coupled in series such that one of the JJs can be biased positively while the other JJ can be biased negatively. Thus, superconducting integrated circuit 200 may be configured such that both positive and negative phase transitions may occur at about the same point in the clock cycle. Alternatively, these JJs may be biased at different times during the clock cycle resulting in a positive phase transition and a negative phase transition at different times during the clock cycle. Each trap circuit may be configured to attenuate any signals generated by the triggering of the Josephson junctions. Thus, trap circuit 210 may be configured to attenuate any SFQ pulse that is generated when Josephson junction 222 is triggered. The built-in capacitance and the inductance associated with a Josephson junction resonates in a frequency band referred to as the plasma frequency of the Josephson junction. Trap circuit 210 is tuned such that its parallel resonant frequency is near the frequency (e.g., the plasma frequency of the Josephson junction) at which Josephson junction 222 rings when it triggers to generate a single flux quantum (SFQ) pulse. Thus tuned, the LC trap presents a high impedance for the frequencies of the SFQ pulse and any pulses that are generated as a result of the ringing of Josephson junction 222. This high impedance greatly attenuates the interference to the Josephson junctions of nearby gates, essentially eliminating the performance degradations that un-attenuated pulses cause. Each of the other trap circuits (e.g., trap circuits 220, 230, 240, 250, 260, 270, and 280) may operate in a similar manner to reduce the crosstalk among Josephson junctions because of the attenuation of the SFQ pulses and any other unwanted signals generated because of the ringing of the Josephson junctions.

In addition, each trap circuit may include a damping resistor (e.g., damping resistors 217, 227, 237, 247, 257, 267, 277, and 287). The damping resistors may increase the bandwidth of the high-impedance frequency range of the trap circuits. Even though the inclusion of the damping resistors may reduce the attenuation caused by the trap circuits, the increase in the bandwidth may reduce crosstalk among Josephson junctions across a wider range of frequencies. The resistance values of the damping resistors may be selected to achieve a desired Q factor.

Figure 3:
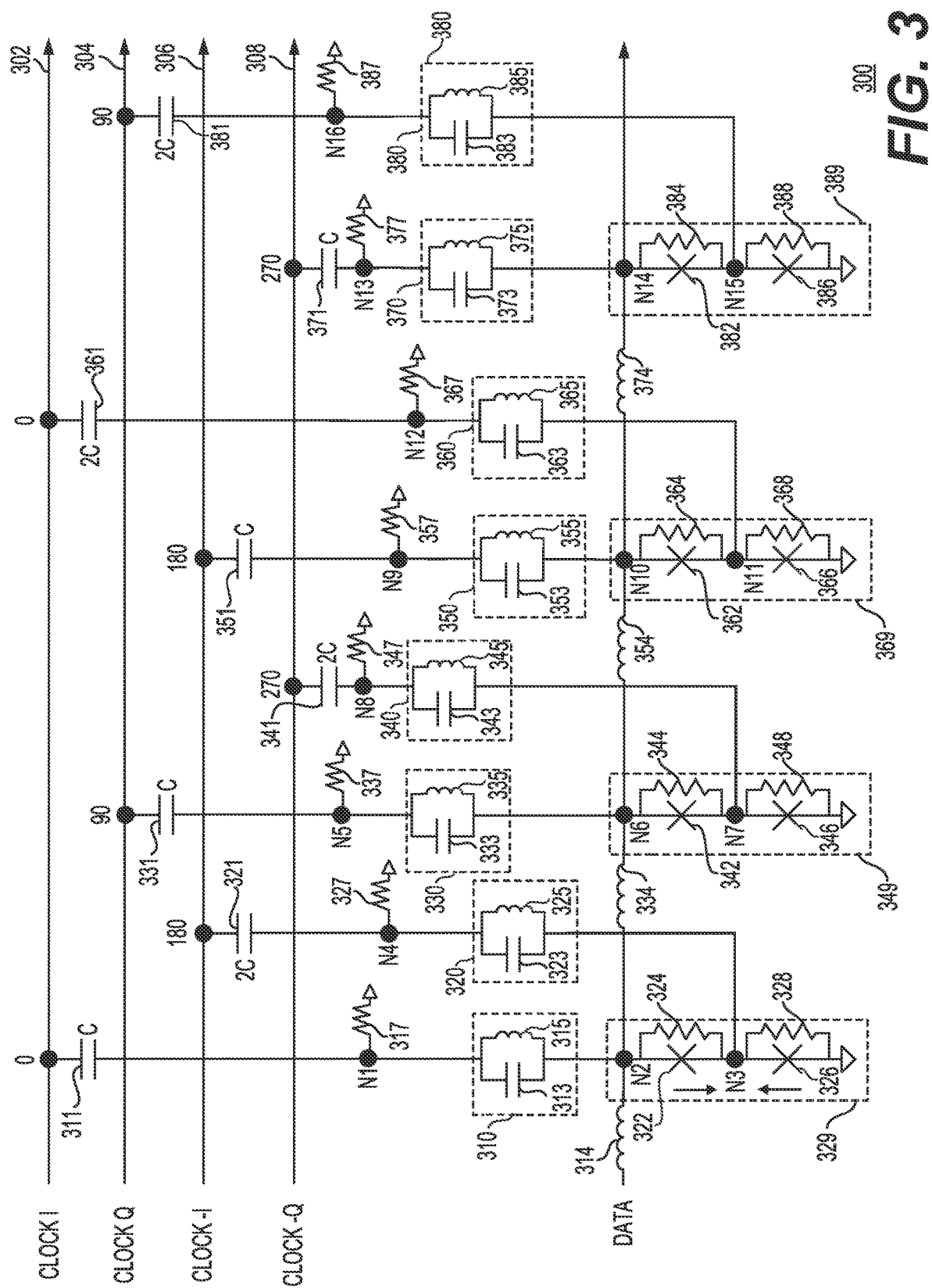
FIG. 3 is a diagram of a superconducting integrated circuit including trap circuits in accordance with another example.

FIG. 3 is a diagram of a superconducting integrated circuit 300 including trap circuits in accordance with another example. Superconducting integrated circuit 300 may also be configured to operate in a wave pipelined RQL logic mode or in phase-mode logic (PML) mode. Superconducting integrated circuit 300 may include superconducting circuit 329 coupled via capacitor 311 to clock line 302 (coupled to the CLOCK I terminal) and further coupled via capacitor 321 to clock line 306 (coupled to the CLOCK –I terminal). As shown in this example, clock line 302 may receive an AC clock signal with a phase of 0 degrees and clock line 306 may receive an AC clock signal with a phase of 180 degrees. Capacitor 321 may be configured to have twice the amount of capacitance (2C) relative to the amount of the capacitance (C) of capacitor 311. This is because the bias current produced by capacitor 321 may have an amplitude that is twice the amplitude of the bias current produced by capacitor 311.

Still referring to FIG. 3, superconducting integrated circuit 300 may include an inductor 314 coupled between a DATA terminal and a node N2. Node N2 may be coupled to receive an AC clock signal via clock line 302 and a node N3 may be coupled to receive an AC clock signal via clock line 306. Superconducting circuit 329 may further include a Josephson junction (JJ) 322 coupled between the node N2 and the node N3. A resistor 324 may also be coupled between the node N2 and the node N3. Another JJ 326 may be coupled between the node N3 and a ground terminal. A resistor 328 may also be coupled between the node N3 and the ground terminal. At about the same time during the clock cycle, JJ 322 may be positively biased (e.g., via the AC clock signal having a phase of 0 degrees, which is received via clock line 302), whereas JJ 326 may be negatively biased (e.g., via the AC clock signal having a phase of 180 degrees, which is received via clock line 306) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 329 may be coupled via inductor 334 to superconducting circuit 349.

A trap circuit 310 may be coupled between a node N1 (coupled to capacitor 311) and node N2. Trap circuit 310 may include a trap capacitor 313 coupled in parallel with a trap inductor 315. A damping resistor 317 may be coupled between node N1 and the ground terminal. Another trap circuit 320 may be coupled between a node N4 (coupled to capacitor 321) and node N3. Trap circuit 320 may include a trap capacitor 323 coupled in parallel with a trap inductor 325. A damping resistor 327 may be coupled between node N4 and the ground terminal.

With continued reference to FIG. 3, superconducting integrated circuit 300 may further include superconducting circuit 349 coupled via capacitor 331 to clock line 304 (coupled to the CLOCK Q terminal) and further coupled via capacitor 341 to clock line 308 (coupled to the –Q terminal). As shown in this example, clock line 304 may receive an AC clock signal with a phase of 90 degrees and clock line 308 may receive an AC clock signal with a phase of 270 degrees. Capacitor 341 may be configured to have twice the amount of capacitance (2C) relative to the amount of the capacitance (C) of capacitor 331. This is because the bias current produced by capacitor 341 may have an amplitude that is twice the amplitude of the bias current produced by capacitor 331.

Still referring to FIG. 3, superconducting circuit 349 may include a node N6 coupled to receive an AC clock signal via clock line 304 and a node N7 coupled to receive an AC clock signal via clock line 308. Superconducting circuit 349 may further include a Josephson junction (JJ) 342 coupled between the node N6 and the node N7. A resistor 344 may also be coupled between the node N6 and the node N7. Another JJ 346 may be coupled between the node N7 and the ground terminal. A resistor 348 may also be coupled between the node N7 and the ground terminal. At about the same time during the clock cycle, JJ 342 may be positively biased (e.g., via the AC clock signal having a phase of 90 degrees, which is received via clock line 304), whereas JJ 346 may be negatively biased (e.g., via the AC clock signal having a phase of 270 degrees, which is received via clock line 308) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 349 may be coupled via inductor 354 to superconducting circuit 359.

A trap circuit 330 may be coupled between a node N5 (coupled to capacitor 331) and node N6. Trap circuit 330 may include a trap capacitor 333 coupled in parallel with a trap inductor 335. A damping resistor 337 may be coupled between node N5 and the ground terminal. Another trap circuit 340 may be coupled between a node N8 (coupled to capacitor 341) and node N7. Trap circuit 340 may include a trap capacitor 343 coupled in parallel with a trap inductor 345. A damping resistor 347 may be coupled between node N8 and the ground terminal.

With continued reference to FIG. 3, superconducting integrated circuit 300 may further include superconducting circuit 369 coupled via capacitor 351 to clock line 306 and further coupled via capacitor 361 to clock line 302. As shown in this example, clock line 302 may receive an AC clock signal with a phase of 0 degrees and clock line 306 may receive an AC dock signal with a phase of 180 degrees. Capacitor 361 may be configured to have twice the amount of capacitance (2C) relative to the amount of the capacitance (C) of capacitor 351. This is because the bias current produced by capacitor 361 may have an amplitude that is twice the amplitude of the bias current produced by capacitor 351.

Still referring to FIG. 3, superconducting circuit 369 may include a node N10 coupled to receive an AC clock signal via clock line 306 and a node N11 coupled to receive an AC clock signal via clock line 302. Superconducting circuit 369 may further include a Josephson junction (JJ) 362 coupled between the node N10 and the node N11. A resistor 364 may also be coupled between the node N10 and the node N11. Another JJ 366 may be coupled between the node N11 and the ground terminal. A resistor 368 may also be coupled between the node N11 and the ground terminal. At about the same time during the clock cycle, JJ 362 may be negatively biased (e.g., via the AC clock signal having a phase of 180 degrees, which is received via clock line 306), whereas JJ 366 may be positively biased (e.g., via the AC clock signal having a phase of 0 degrees, which is received via clock line 302) resulting in a positive phase transition and a negative phase transition at about the same time during the clock cycle. Alternatively, these JJs may be biased at different times during the clock cycle resulting in a positive phase transition and a negative phase transition at different times during the clock cycle. Superconducting circuit 369 may be coupled via inductor 374 to superconducting circuit 389.

A trap circuit 350 may be coupled between a node N9 (coupled to capacitor 351) and node N10. Trap circuit 350 may include a trap capacitor 353 coupled in parallel with a trap inductor 355. A damping resistor 357 may be coupled between node N9 and the ground terminal. Another trap circuit 360 may be coupled between a node N12 (coupled to capacitor 361) and node N11. Trap circuit 360 may include a trap capacitor 363 coupled in parallel with a trap inductor 365. A damping resistor 367 may be coupled between node N12 and the ground terminal.

With continued reference to FIG. 3, superconducting integrated circuit 300 may further include superconducting circuit 389 coupled via capacitor 371 to clock line 384 and further coupled via capacitor 381 to clock line 304. As shown in this example, clock line 304 may receive an AC clock signal with a phase of 90 degrees and clock line 308 may receive an AC clock signal with a phase of 270 degrees. Capacitor 381 may be configured to have twice the amount of capacitance (2C) relative to the amount of the capacitance (C) of capacitor 371. This is because the bias current produced by capacitor 381 may have an amplitude that is twice the amplitude of the bias current produced by capacitor 371.

Still referring to FIG. 3, superconducting circuit 389 may include a node N14 coupled to receive an AC clock signal via clock line 308 and a node N15 coupled to receive an AC clock signal via clock line 304. Superconducting circuit 389 may further include a Josephson junction (JJ) 382 coupled between the node N14 and the node N15. A resistor 384 may also be coupled between the node N14 and the node N15. Another JJ 386 may be coupled between the node N15 and the ground terminal. A resistor 388 may also be coupled between the node N15 and the ground terminal. At about the same time during the clock cycle, JJ 382 may be negatively biased (e.g., via the AC clock signal having a phase of 270 degrees, which is received via clock line 308), whereas JJ 386 may be positively biased (e.g., via the AC clock signal having a phase of 90 degrees, which is received via clock line 304) resulting in a positive phase transition and a negative phase transition at about the same time during the clock cycle. Alternatively, these JJs may be biased at different times during the clock cycle resulting in a positive phase transition and a negative phase transition at different times during the clock cycle.

A trap circuit 370 may be coupled between a node N13 (coupled to capacitor 371) and node N14. Trap circuit 370 may include a trap capacitor 373 coupled in parallel with a trap inductor 375. A damping resistor 377 may be coupled between node N13 and the ground terminal. Another trap circuit 380 may be coupled between a node N16 (coupled to capacitor 381) and node N15. Trap circuit 380 may include a trap capacitor 383 coupled in parallel with a trap inductor 385. A damping resistor 387 may be coupled between node N16 and the ground terminal.

In one example, clock and power to Josephson junctions and other circuit components may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately $\lambda/4$ long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 3 shows a certain number of components of superconducting integrated circuit 300 arranged in a certain manner, there could be more or fewer number of components arranged differently. As an example, although FIG. 3 shows a specific circuit, superconducting integrated circuit 300 may include other types of circuits, such as a logic gate, a flip-flop, or a memory circuit. In addition, although FIG. 3 shows a phase separation of 90 degrees between the clock signals and four clock lines, a phase separation of 120 degrees between the clock signals and three clock lines may also be used. Moreover, although FIG. 3 shows certain phase values associated with the clock lines, the clock lines need not receive clock signals with the phase value shown in FIG. 3. As an example, clock line 302 may receive an AC clock signal with a phase of 270 degrees, clock line 304 may receive an AC clock signal with a phase of 0 degrees, clock line 306 may receive an AC clock signal with a phase of 90 degrees, and clock line 308 may receive an AC clock signal with a phase of 180 degrees. Other phase allocations may also be used.

In terms of the operation of superconducting integrated circuit 300, the AC clock signals may once again provide bias current to Josephson junctions. Superconducting circuits 329, 349, 369, and 389 include Josephson junctions coupled in series such that one of the JJs can be biased positively while the other JJ can be biased negatively. Thus, superconducting integrated circuit 300 may be configured such that both positive and negative phase transitions may occur at about the same point in the clock cycle. Alternatively, these JJs may be biased at different times during the clock cycle resulting in a positive phase transition and a negative phase transition at different times during the clock cycle. Each trap circuit may be configured to attenuate any signals generated by the triggering of the Josephson junctions. Thus, trap circuit 310 may be configured to attenuate any SFQ pulse that is generated when Josephson junction 322 is triggered. The built-in capacitance and the inductance associated with a Josephson junction resonates in a frequency band referred to as the plasma frequency of the Josephson junction. Trap circuit 310 is tuned such that its parallel resonant frequency is near the frequency (e.g., the plasma frequency of the Josephson junction) at which Josephson junction 322 rings when it triggers to generate a single flux quantum (SFQ) pulse. Thus tuned, the LC trap presents a high impedance for the frequencies of the SFQ pulse and any pulses that are generated as a result of the ringing of Josephson junction 322. This high impedance greatly attenuates the interference to the Josephson junctions of nearby gates, essentially eliminating the performance degradations that un-attenuated pulses cause. Each of the other trap circuits (e.g., trap circuits 320, 330, 340, 350, 360, 370, and 380) may operate in a similar manner to reduce the crosstalk among Josephson junctions because of the attenuation of the SFQ pulses and any other unwanted signals generated because of the ringing of the Josephson junctions.

In addition, each trap circuit may include a damping resistor (e.g., damping resistors 317, 327, 337, 347, 357, 367, 377, and 387). The damping resistors may increase the bandwidth of the high-impedance frequency range of the trap circuits. Even though the inclusion of the damping resistors may reduce the attenuation caused by the trap circuits, the increase in the bandwidth may reduce crosstalk among Josephson junctions across a wider range of frequencies. The resistance values of the damping resistors may be selected to achieve a desired Q factor.

Figure 4:
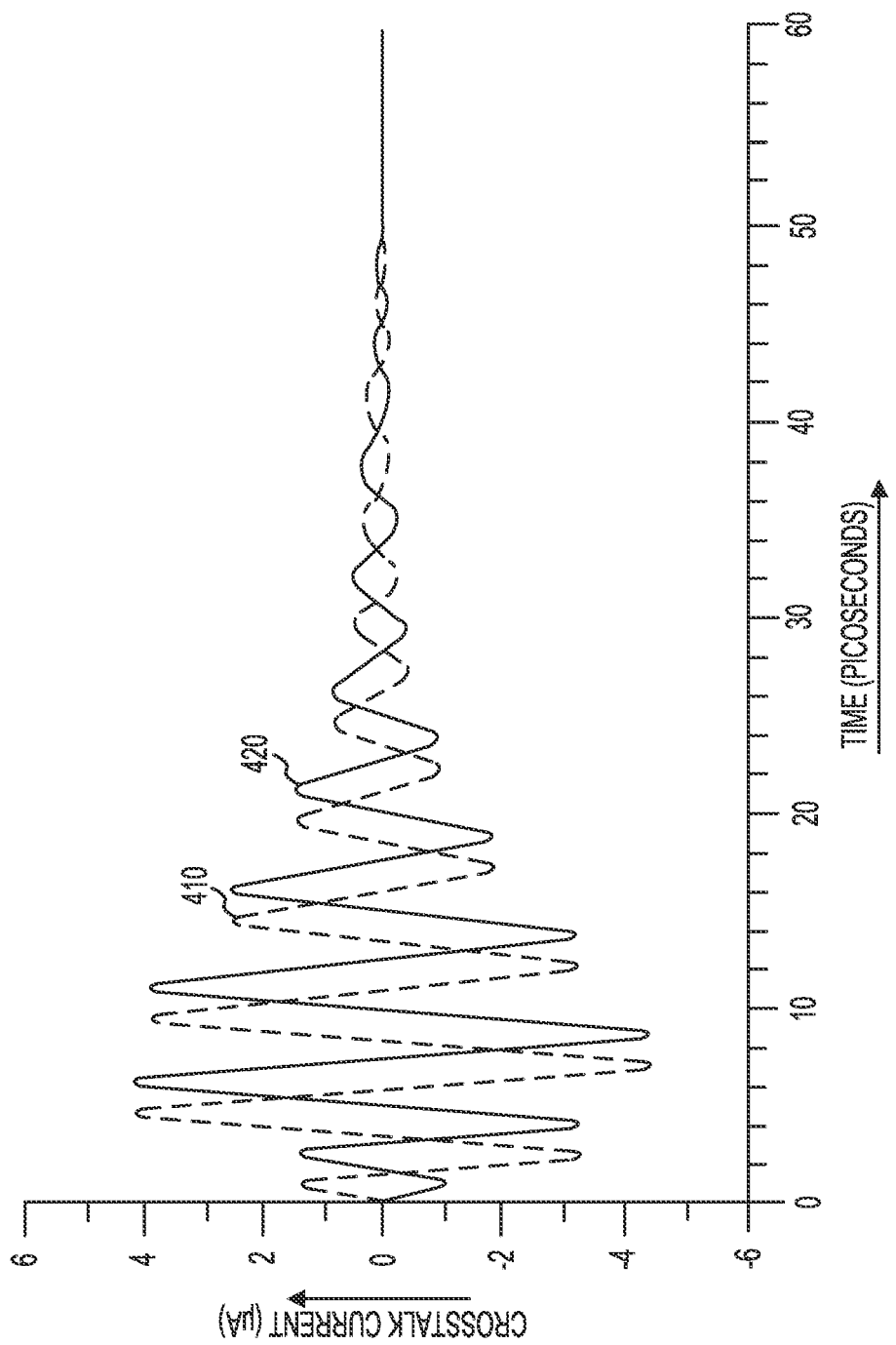
FIG. 4 is a graph showing the crosstalk in the absence of the example trap circuits in a superconducting integrated circuit.

FIG. 4 is a graph 400 showing the crosstalk in the absence of the example trap circuits in a superconducting integrated circuit. Curve 410 shows the amount of unwanted crosstalk current in a Josephson junction without a use of a trap circuit. Curve 420 shows the amount of unwanted crosstalk current in another Josephson junction without the use of a trap circuit. As explained earlier, the Josephson junctions may receive clock signals having an opposite phase resulting in a differential arrangement.

Figure 5:
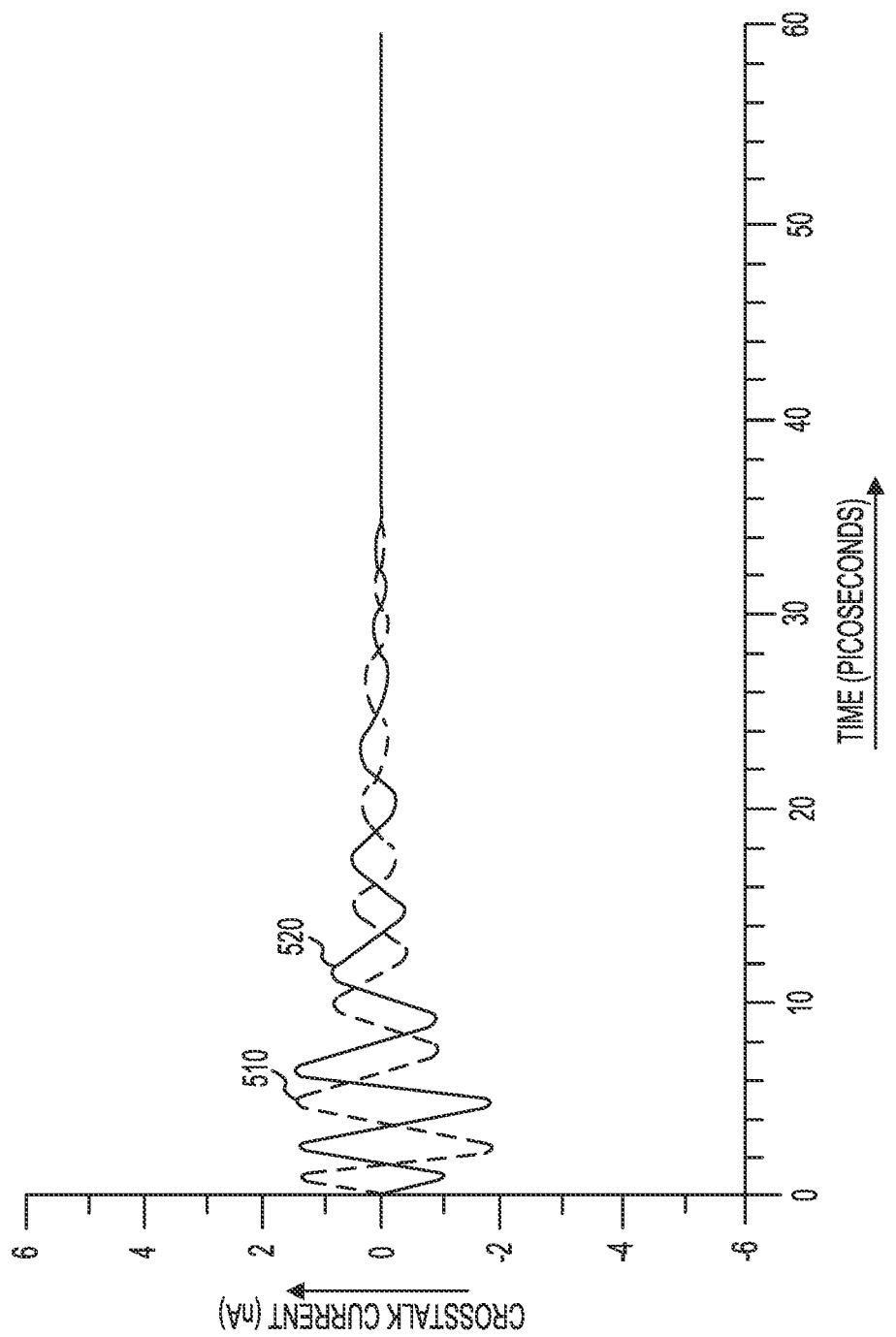
FIG. 5 is a graph showing the reduced crosstalk in the presence of the example trap circuits in a superconducting integrated circuit.

FIG. 5 is a graph showing the reduced crosstalk in the presence of the example trap circuits in a superconducting integrated circuit. Curve 510 shows the reduced crosstalk current in a Josephson junction when a trap circuit is used. As an example, trap circuit 110 may reduce the crosstalk current when JJ 122, which is included as part of superconducting circuit 129, is triggered. Curve 520 shows the reduced crosstalk current in a similar Josephson junction when a trap circuit is used. As an example, trap circuit 120 may reduce the crosstalk current when JJ 126, which is also included as part of superconducting circuit 129, is triggered.

Any of the superconducting integrated circuits described herein may be implemented using large scale integrated circuit manufacturing techniques using a process involving niobium metal layers to form the clock lines and the ground plane. To determine the amount of capacitance required for the capacitors for use with an integrated circuit the following equation may be used: $V2\pi fC = I_{JJ}$, where $I_{JJ}$ represents the Josephson junction current, V is the voltage across the capacitor, f is the frequency of the alternating current clock signal, and C is the capacitance of the capacitor. In this example, the impedance ($Z_c$) seen by the clock signal may be represented by the equation: $Z_c = 1/\{2\pi fC\}$. Advantageously, capacitive coupling allows the use of high-frequency clock signals because the impedance seen by the clock signal is inversely proportional to the frequency of the clock signal. Moreover, advantageously, the use of the trap circuits helps reduce unwanted crosstalk in such capacitively-coupled resonant clock networks.

In conclusion, in one example, the present disclosure relates to a superconducting integrated circuit including a first superconducting circuit comprising: (1) a first Josephson junction coupled via a first capacitor to a first clock line, where the first capacitor is configured to receive a first clock signal having a first phase via the first clock line and couple a first bias current to the first Josephson junction, and (2) a second Josephson junction coupled via a second capacitor to a second clock line, where the second capacitor is configured to receive a second clock signal having a second phase, different from the first phase, via the second clock line and couple a second bias current to the second Josephson junction. The superconducting integrated circuit may further include a second superconducting circuit comprising: (1) a third Josephson junction coupled via a third capacitor to the first clock line, where the third capacitor is configured to receive the first clock signal having the first phase via the first clock line and couple a third bias current to the third Josephson junction, and (2) a fourth Josephson junction coupled via a fourth capacitor to the second clock line, where the fourth capacitor is configured to receive the second clock signal having the second phase via the second clock line and couple a fourth bias current to the fourth Josephson junction. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second capacitor and the second Josephson junction, where the second trap circuit is configured to attenuate any signals generated by a triggering of the second Josephson junction to reduce crosstalk between the second Josephson junction and the fourth Josephson junction.

The first trap circuit may comprise a first trap capacitor coupled in parallel with a first trap inductor to form a first LC tank, and the second trap circuit may comprise a second trap capacitor coupled in parallel with a second trap inductor to form a second LC tank. The first trap circuit may further comprise a first damping resistor coupled in parallel to the first LC tank, and the second trap circuit may further comprise a second damping resistor coupled in parallel to the second LC tank. The superconducting integrated circuit may further include a first damping resistor coupled to a first node between the first trap circuit and a ground terminal, and a second damping resistor coupled to a second node between the second trap capacitor and the ground terminal.

The first clock signal may comprise a first alternating current clock signal configured to supply power to any superconducting circuits coupled to the first clock line, and the second clock signal may comprise a second alternating current clock signal configured to supply power to any superconducting circuits coupled to the second clock line. As part of the superconducting integrated circuit, the first phase may be different from the second phase by an amount of 180 degrees.

The first Josephson junction may have a first plasma frequency, and the first trap circuit may be configured to attenuate at least any signals having a first frequency in a range between 0.8 times the first plasma frequency to 1.2 times the first plasma frequency. The second Josephson junction may have a second plasma frequency, and the second trap circuit may be configured to attenuate at least any signals having a second frequency in a range between 0.8 times the second plasma frequency to 1.2 times the second plasma frequency.

In another aspect, the present disclosure relates to a superconducting integrated circuit including a resonant clock network capacitively-coupled to: (1) a first superconducting circuit comprising a first Josephson junction and a second Josephson junction, and (2) a second superconducting circuit comprising a third Josephson junction and a fourth Josephson junction. The superconducting integrated circuit may further include a first trap circuit coupled between the first Josephson junction and the resonant clock network, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second Josephson junction and the resonant clock network, where the second trap circuit is configured to attenuate any signals generated by a triggering of the second Josephson junction to reduce crosstalk between the second Josephson junction and the fourth Josephson junction.

The first trap circuit may comprise a first trap capacitor coupled in parallel with a first trap inductor to form a first LC tank, and the second trap circuit may comprise a second trap capacitor coupled in parallel with a second trap inductor to form a second LC tank. The first trap circuit may further comprise a first damping resistor coupled in parallel to the first LC tank, and the second trap circuit may further comprise a second damping resistor coupled in parallel to the second LC tank. The superconducting integrated circuit may further include a first damping resistor coupled to a first node between the first trap circuit and a ground terminal, and a second damping resistor coupled to a second node between the second trap capacitor and the ground terminal.

The resonant clock network may be configured to supply clock signals to any superconducting circuits coupled to the resonant clock network. The first Josephson junction may have a first plasma frequency, and the first trap circuit may be configured to attenuate at least any signals having a first frequency in a range between 0.8 times the first plasma frequency to 1.2 times the first plasma frequency. The second Josephson junction may have a second plasma frequency, and the second trap circuit may be configured to attenuate at least any signals having a second frequency in a range between 0.8 times the second plasma frequency to 1.2 times the second plasma frequency.

In yet another aspect, the present disclosure relates to a superconducting integrated circuit including a first superconducting circuit comprising: (1) a first Josephson junction coupled via a first capacitor to a first clock line, where the first capacitor is configured to receive a first alternating current (AC) clock signal having a first phase via the first clock line and couple a first bias current to the first Josephson junction, and (2) a second Josephson junction coupled via a second capacitor to a second clock line, where the second capacitor is configured to receive a second AC clock signal having a second phase, opposite to the first phase, via the second clock line and couple a second bias current to the second Josephson junction. The superconducting integrated circuit may further include a second superconducting circuit comprising: (1) a third Josephson junction coupled via a third capacitor to the first clock line, where the third capacitor is configured to receive the first AC clock signal having the first phase via the first clock line and couple a third bias current to the third Josephson junction, and (2) a fourth Josephson junction coupled via a fourth capacitor to the second clock line, where the fourth capacitor is configured to receive the second AC clock signal having the second phase via the second clock line and couple a fourth bias current to the second Josephson junction. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the third Josephson junction. The superconducting integrated circuit may further include a second trap circuit coupled between the second capacitor and the second Josephson junction, wherein the second trap circuit is configured to attenuate any signals generated by a triggering of the second Josephson junction to reduce crosstalk between the second Josephson junction and the fourth Josephson junction.

The first trap circuit may comprise a first trap capacitor coupled in parallel with a first trap inductor to form a first LC tank, and the second trap circuit may comprise a second trap capacitor coupled in parallel with a second trap inductor to form a second LC tank. The first trap circuit may further comprise a first damping resistor coupled in parallel to the first LC tank, and the second trap circuit may further comprise a second damping resistor coupled in parallel to the second LC tank. The superconducting integrated circuit may further include a first damping resistor coupled to a first node between the first trap circuit and a ground terminal, and a second damping resistor coupled to a second node between the second trap capacitor and the ground terminal.

The first AC clock signal may be configured to supply power to any superconducting circuits coupled to the first clock line, and the second AC clock signal may be configured to supply power to any superconducting circuits coupled to the second clock line. As part of the superconducting integrated circuit, the first phase may be different from the second phase by an amount of 180 degrees.

The first Josephson junction may have a first plasma frequency, and the first trap circuit may be configured to attenuate at least any signals having a first frequency in a range between 0.8 times the first plasma frequency to 1.2 times the first plasma frequency. The second Josephson junction may have a second plasma frequency, and the second trap circuit may be configured to attenuate at least any signals having a second frequency in a range between 0.8 times the second plasma frequency to 1.2 times the second plasma frequency.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting integrated circuit comprising:
a first superconducting circuit comprising: (1) a first Josephson junction coupled via a first capacitor to a first clock line, wherein the first capacitor is configured to receive a first clock signal having a first phase via the first clock line and couple a first bias current to the first Josephson junction, and (2) a second Josephson junction coupled via a second capacitor to a second clock line, wherein the second capacitor is configured to receive a second clock signal having a second phase, different from the first phase, via the second clock line and couple a second bias current to the second Josephson junction;
a second superconducting circuit comprising: (1) a third Josephson junction coupled via a third capacitor to the first clock line, wherein the third capacitor is configured to receive the first clock signal having the first phase via the first clock line and couple a third bias current to the third Josephson junction, and (2) a fourth Josephson junction coupled via a fourth capacitor to the second clock line, wherein the fourth capacitor is configured to receive the second clock signal having the second phase via the second clock line and couple a fourth bias current to the fourth Josephson junction;
a first trap circuit coupled between the first capacitor and the first Josephson junction, wherein the first trap circuit is configured to attenuate any signals generated by a triggering of the first Josephson junction to reduce crosstalk between the first Josephson junction and the third Josephson junction; and
a second trap circuit coupled between the second capacitor and the second Josephson junction, wherein the second trap circuit is configured to attenuate any signals generated by a triggering of the second Josephson junction to reduce crosstalk between the second Josephson junction and the fourth Josephson junction.

2. The superconducting integrated circuit of claim 1, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

3. The superconducting integrated circuit of claim 2, wherein the first trap circuit further comprises a first damping resistor coupled in parallel to the first LC tank, and wherein the second trap circuit further comprises a second damping resistor coupled in parallel to the second LC tank.

4. The superconducting integrated circuit of claim 1, further comprising a first damping resistor coupled to a first node between the first trap circuit and a ground terminal, and a second damping resistor coupled to a second node between the second trap capacitor and the ground terminal.

5. The superconducting integrated circuit of claim 1, wherein the first clock signal comprises a first alternating current clock signal configured to supply power to any superconducting circuits coupled to the first clock line, and wherein the second clock signal comprises a second alternating current clock signal configured to supply power to any superconducting circuits coupled to the second clock line.

6. The superconducting integrated circuit of claim 1, wherein the first phase is different from the second phase by an amount of 180 degrees.

7. The superconducting integrated circuit of claim 1, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the second Josephson junction has a second plasma frequency, and wherein the second trap circuit is configured to attenuate at least any signals having a second frequency in a range between 0.8 times the second plasma frequency to 1.2 times the second plasma frequency.

8. A superconducting integrated circuit comprising:
a resonant clock network capacitively-coupled to: (1) a first superconducting circuit comprising a first Josephson junction and a second Josephson junction, and (2) a second superconducting circuit comprising a third Josephson junction and a fourth Josephson junction;
a first trap circuit coupled between the first Josephson junction and the resonant clock network, wherein the first trap circuit is configured to attenuate any signals generated by a triggering of the first Josephson junction to reduce crosstalk between the first Josephson junction and the third Josephson junction; and
a second trap circuit coupled between the second Josephson junction and the resonant clock network, wherein the second trap circuit is configured to attenuate any signals generated by a triggering of the second Josephson junction to reduce crosstalk between the second Josephson junction and the fourth Josephson junction.

9. The superconducting integrated circuit of claim 8, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

10. The superconducting integrated circuit of claim 9, wherein the first trap circuit further comprises a first damping resistor coupled in parallel to the first LC tank, and wherein the second trap circuit further comprises a second damping resistor coupled in parallel to the second LC tank.

11. The superconducting integrated circuit of claim 8, further comprising a first damping resistor coupled to a first node between the first trap circuit and a ground terminal, and a second damping resistor coupled to a second node between the second trap circuit and the ground terminal.

12. The superconducting integrated circuit of claim 8, wherein the resonant clock network is configured to supply clock signals to any superconducting circuits coupled to the resonant clock network.

13. The superconducting integrated circuit of claim 8, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the second Josephson junction has a second plasma frequency, and wherein the second trap circuit is configured to attenuate at least any signals having a second frequency in a range between 0.8 times the second plasma frequency to 1.2 times the second plasma frequency.

14. A superconducting integrated circuit comprising:
a first superconducting circuit comprising: (1) a first Josephson junction coupled via a first capacitor to a first clock line, wherein the first capacitor is configured to receive a first alternating current (AC) clock signal having a first phase via the first clock line and couple a first bias current to the first Josephson junction, and (2) a second Josephson junction coupled via a second capacitor to a second clock line, wherein the second capacitor is configured to receive a second AC clock signal having a second phase, opposite to the first phase, via the second clock line and couple a second bias current to the second Josephson junction;
a second superconducting circuit comprising: (1) a third Josephson junction coupled via a third capacitor to the first clock line, wherein the third capacitor is configured to receive the first AC clock signal having the first phase via the first clock line and couple a third bias current to the third Josephson junction, and (2) a fourth Josephson junction coupled via a fourth capacitor to the second clock line, wherein the fourth capacitor is configured to receive the second AC clock signal having the second phase via the second clock line and couple a fourth bias current to the second Josephson junction;
a first trap circuit coupled between the first capacitor and the first Josephson junction, wherein the first trap circuit is configured to attenuate any signals generated by a triggering of the first Josephson junction to reduce crosstalk between the first Josephson junction and the third Josephson junction; and
a second trap circuit coupled between the second capacitor and the second Josephson junction, wherein the second trap circuit is configured to attenuate any signals generated by a triggering of the second Josephson junction to reduce crosstalk between the second Josephson junction and the fourth Josephson junction.

15. The superconducting integrated circuit of claim 14, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

16. The superconducting integrated circuit of claim 15, wherein the first trap circuit further comprises a first damping resistor coupled in parallel to the first LC tank, and wherein the second trap circuit further comprises a second damping resistor coupled in parallel to the second LC tank.

17. The superconducting integrated circuit of claim 14, further comprising a first damping resistor coupled to a first node between the first trap circuit and a ground terminal, and a second damping resistor coupled to a second node between the second trap circuit and the ground terminal.

18. The superconducting integrated circuit of claim 14, wherein the first AC clock signal is configured to supply power to any superconducting circuits coupled to the first clock line, and wherein the second AC clock signal is configured to supply power to any superconducting circuits coupled to the second clock line.

19. The superconducting integrated circuit of claim 18, wherein the first phase is different from the second phase by an amount of 180 degrees.

20. The superconducting integrated circuit of claim 14, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the second Josephson junction has a second plasma frequency, and wherein the second trap circuit is configured to attenuate at least any signals having a second frequency in a range between 0.8 times the second plasma frequency to 1.2 times the second plasma frequency.

* * * * *